United States Patent [19]
Rhodes et al.

[11] Patent Number: 6,110,789
[45] Date of Patent: Aug. 29, 2000

[54] CONTACT FORMATION USING TWO ANNEAL STEPS

[75] Inventors: Howard E. Rhodes; Philip J. Ireland, both of Boise; Kenneth N. Hagen; Zhiqiang Wu, both of Meridan, all of Id.

[73] Assignee: Micron Technology, Inc., Boise, Id.

[21] Appl. No.: 08/906,889

[22] Filed: Aug. 6, 1997

[51] Int. Cl.[7] .................................................. H01L 21/336
[52] U.S. Cl. ......................... 438/305; 438/660; 438/663; 438/530; 438/653; 438/627; 438/643; 438/592
[58] Field of Search ..................................... 438/660, 663, 438/530, 653, 627, 643, 305, 592

[56] References Cited

U.S. PATENT DOCUMENTS

| | | | |
|---|---|---|---|
| 4,891,328 | 1/1990 | Gris ............................................. | 437/59 |
| 5,232,874 | 8/1993 | Rhodes et al. ........................... | 437/195 |
| 5,240,874 | 8/1993 | Roberts ..................................... | 437/69 |

OTHER PUBLICATIONS

Wolf, Silicon Processing for the VLSI Era:vol. 1—Process Technology, Lattice Press, pp. 57, 303–307, 327, 398 & 399, 1986.

Wolf, Silicon Processing for the VLSI Era:vol. 2—Process Integration, Lattice Press, p. 132, 1986.

Fuse et al.; A Practical Trench Isolation Technology With A Novel Planarization Process; IEEE; pp. 732–735; 1987.

Hori et al.; A New Submicron MOSFET With LATID (Large–Tilt–Angle Implanted Drain) Structure; Japan; pp. 15–16; 1988.

Hori; ¼–$\mu$m LATID (Large–Tilt–Angle Implanted Drain) Technology for 3.3–V Operation; Japan; 1989.

Nagatomo et al.; A High Density 4M DRAM Process Using Folded Bitline Adaptive Side–Wall Isolated Capacitor (FASIC) Cell; IEEE; pp. 144–147; 1986.

Sunouchi et al; Process Integration For 64M DRAM Using An Asymmetrical Stacked Trench Capacitor (AST) Cell; IEEE; pp. 647–650; 1990.

*Primary Examiner*—Richard Booth
*Assistant Examiner*—David A. Zarneke
*Attorney, Agent, or Firm*—Fletcher, Yoder & Van Someren

[57] ABSTRACT

A method of forming a contact is provided. The method includes the steps of forming a contact hole, creating an enhanced doped region in the contact hole, annealing the enhanced doped region, depositing a barrier metal in the contact hole, annealing the barrier material, and depositing a conductive material in the contact hole. A contact made in this manner exhibits lower contact-to-substrate leakage currents than does a contact formed via conventional single-anneal techniques.

36 Claims, 5 Drawing Sheets

CONTACT FORMATION USING TWO ANNEAL STEPS

BACKGROUND OF THE INVENTION

1. Field of the Invention

The invention relates in general to the field of semiconductor fabrication and, more particularly, to an improved intralayer contact formation process. Specifically, one aspect of the invention relates to a method for reducing contact leakage beneath a contact by using two annealing steps.

2. Description of the Related Art

State of the art microelectronic circuits are produced by semiconductor fabrication processes that manufacture a large number of identical microelectronic devices across a single semiconductor substrate or wafer. As shown in FIG. 1, a typical semiconductor wafer 100 is comprised of a number of different regions, known as die regions 105. During fabrication, a as microelectronic circuit 110 is replicated in most or all of a wafer's dies 105. One such microelectronic circuit is a dynamic random access memory (DRAM) such as manufactured by Micron Technology, Inc. This illustrative memory circuit includes a memory array 112 and peripheral circuitry such as read/write control logic 11 5, address decode logic 120, input and output buffer memory 125, and refresh logic 130.

Common to virtually all microelectronic fabrication processes is the need to form conductive paths between different regions/devices that have been fabricated in a die. One customary technique to interconnect individual devices, such as transistors, and/or other electrical components, such as capacitors, is through the use of contacts. Contacts are typically holes that are formed between one layer and another that are filled with a conductive material to form a conductive path.

As component packing densities increase, the potential for contact-to-substrate leakage also increases. Here, contact-to-substrate leakage refers to current leakage through the contact fill material to the underlying semiconductor substrate. Two well-known causes of increased contact-to-substrate leakage are: (1) misaligned between the contact hole and the targeted underlying region of the semiconductor and (2) excessive etching during contact hole formation. Both of these problems may lead to increased current leakage and, as a result, reduced circuit performance.

Conventional contact formation processes include a plug implantation operation to reduce the amount of contact-to-substrate leakage current. A plug implantation operation implants a species of charge carrier into the bottom of the contact hole. Contacts formed in a N-type active region typically use a N-type implant material such as, for example, phosphorous or arsenic. Contacts formed in a P-type active region typically use a P-type implant material such as, for example, boron.

Prior art techniques used to create contacts typically include the following steps: (1) forming a contact hole; (2) implanting a dopant into the bottom of the contact hole; (3) depositing a barrier material, such as titanium, for example, to coat the contact hole's surfaces; (4) annealing the structure; and (5) filling the contact hole with a suitable conductive material. The single annealing step must simultaneously serve four functions: (1) diffusion of the plug enhancement dopant species; (2) formation of silicide; (3) activation of the plug implant; and (4) correction of damage caused by the implantation.

The permissible time and temperature ranges for successful silicide formation are normally quite narrow. Consequently, the single anneal step is, of necessity, normally restricted to those range limitations. As a result, the diffusion of the plug enhancement dopant species may not be performed under time and temperature conditions that are optimal for diffusion of that particular dopant species in a given device. This can lead to increased contact-to-substrate leakage currents. Also, the single anneal step may not adequately activate the plug implant or repair the damage caused by the implantation.

The present invention may address one or more of the problems set forth above.

SUMMARY OF THE INVENTION

In accordance with one aspect of the present invention, a method of forming a contact in a semiconductor device is provided. The device includes a substrate that has a doped region and a layer formed over the doped region. The method includes the steps of forming a contact hole in the dielectric and exposing a portion of the doped region. The exposed portion of the doped region is further doped to form an enhanced doped region. A first anneal operation is performed. A barrier material is deposited onto the enhanced doped region. A second anneal operation is performed. A conductive material is deposited in the contact hole.

In accordance with another aspect of the present invention, a method of forming a contact in a semiconductor device is provided. The device includes a substrate that has a first region containing a first dopant species and that has a layer formed over the first region. A contact hole is formed in the layer to expose a portion of the first region. The exposed portion of the first region is implanted with the first dopant species to form a second doped region. The second doped region is annealed at between about 700 and about 950° C. for between about 1 second to about 2 hours. A barrier material is deposited onto the exposed portion. The barrier material is annealed at between about 600 and about 850° C. for between about 1 second to about 1 hour. A conductive material is deposited in the contact hole.

In accordance with yet another aspect of the present invention, a method of forming a memory circuit is provided. A substrate is provided that has a doped region and a layer formed over the doped region. A memory array is provided on the substrate. Peripheral circuitry is provided on the substrate for controlling the operation of the memory array. A plurality of contacts are formed in the memory array and in the peripheral circuitry. To form the contacts, a plurality of contact holes are formed in the layer to expose a plurality of portions of the doped region. The exposed portions of the doped regions are further doped to form a plurality of enhanced doped regions. The enhanced doped regions is annealed. A barrier material is deposited onto the enhanced doped regions. The barrier material is annealed.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Turning now to the drawings, an illustrative embodiment of the invention is described below as it might be employed in the fabrication of a semiconductor device, such as a dynamic random access memory (DRAM) circuit. In the interest of clarity, not all features of an actual implementation are described in this specification. It will of course be appreciated that in the development of any such actual embodiment numerous implementation-specific decisions are typically made to achieve the developers' specific goals, such as compliance with system-related and business-related constraints, which may vary from one implementation to another. Moreover, it will be appreciated that such a development effort might be complex and time-consuming, but would nevertheless be a routine engineering undertaking for those having the benefit of this disclosure.

Figure 2:
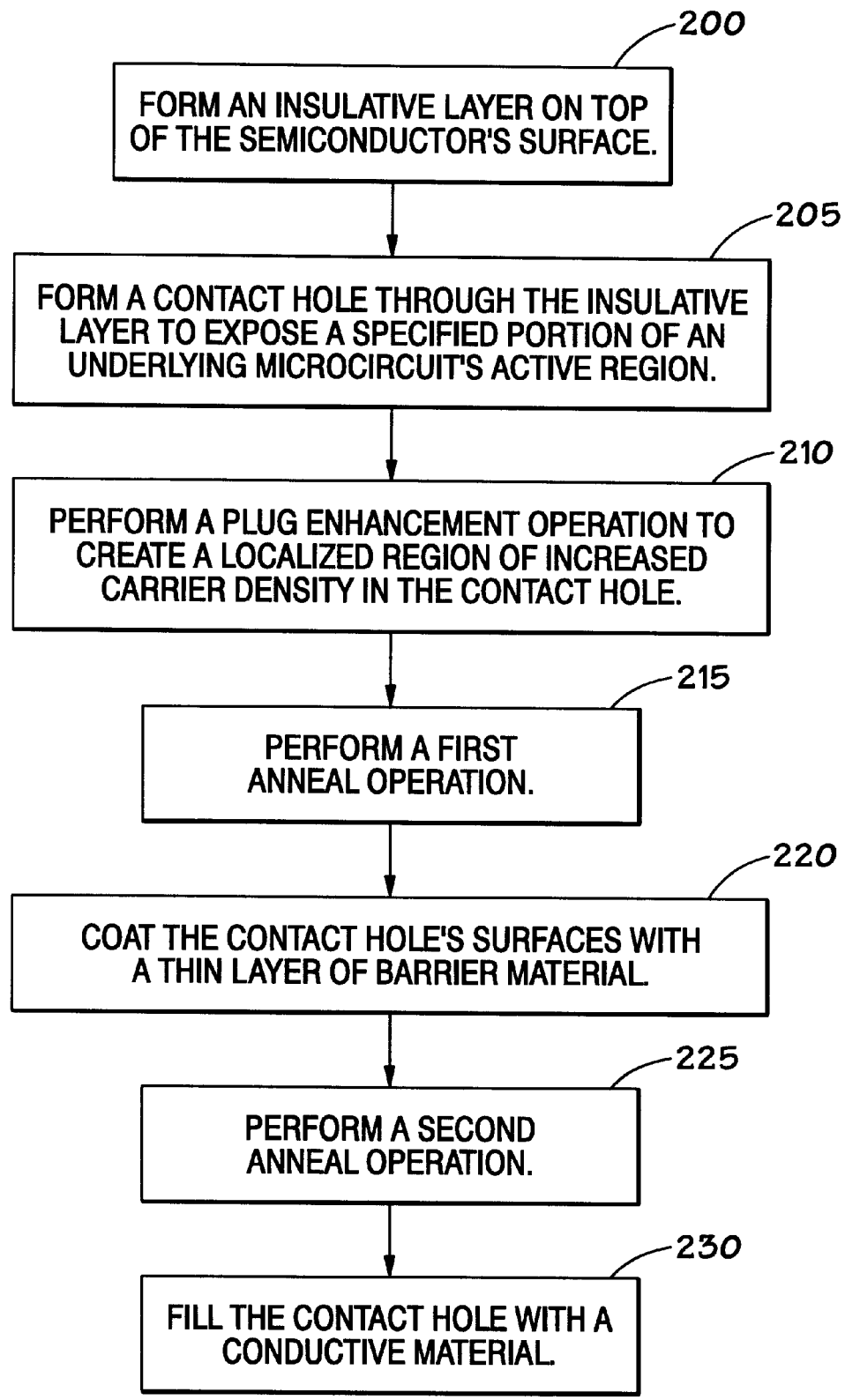
FIG. 2 is a flow diagram of the one embodiment of a contact formation process in accordance with the present invention.

An illustrative process used to form a contact in a semiconductor device is outlined in FIG. 2. First, an insulative layer is formed over the semiconductor's surface (block 200). Next, a contact hole is formed through the insulative layer to expose a specified portion of an underlying microcircuit's active region (block 205). Next, a plug enhancement operation (block 210) is performed which is followed by a first anneal operation (block 215). Following the first annealing operation, a barrier material, such as titanium, is deposited to coat the contact hole's surfaces (block 220). Next, a second anneal operation is performed (block 225). Finally, the contact hole is filled with a conductive material to complete the contact (block 230).

In this embodiment, the first anneal operation of block 215 activates the region of enhanced doping created during step of block 210. This first anneal operation also diffuses the dopant implanted during the plug enhancement operation of block 210, as well as repairs some of the damage to the substrate created by the plug enhancement operation. The goal of the second anneal operation of block 225 is to form a silicide to enhance electrical contact between the barrier material and the underlying semiconductor material and to improve the adhesion characteristics between the barrier material and the contact fill material. The two separate anneal operations, one after plug enhancement and one after formation of a barrier layer, are each optimized with respect to both temperature and time to achieve their goals. The result of the process outlined in FIG. 2 is the formation of contacts which exhibit significantly less contact-to-substrate leakage than prior art contacts, as will be discussed below with reference to FIGS. 4 and 5.

Figure 3A:
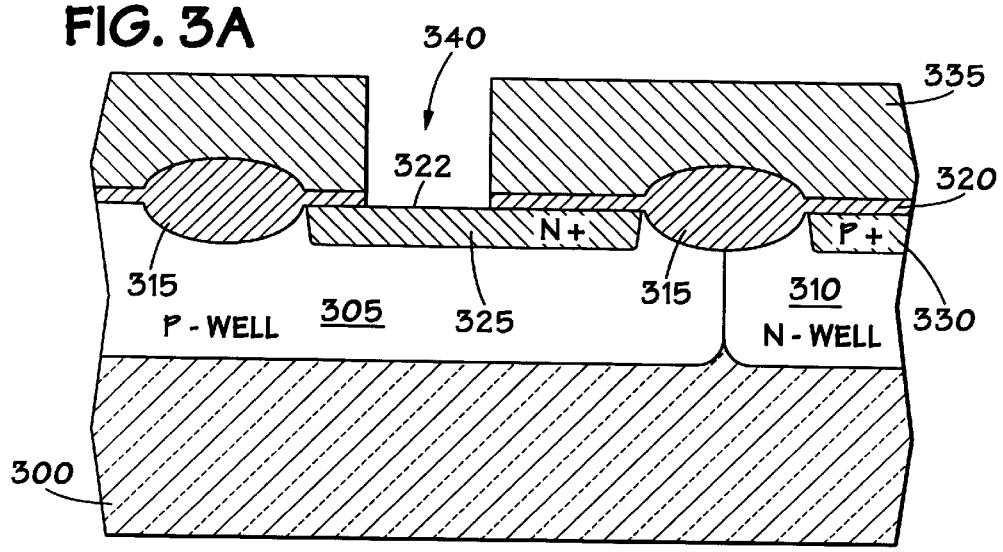
FIG. 3A shows a simplified cross-sectional view of part of a semiconductor wafer die in which a contact hole has been formed in accordance with the invention.

A specific example of a contact formed using a two-anneal process will now be discussed by reference to FIG. 3A which illustrates a simplified cross-sectional view of part of the die 105 of FIG. 1. In this example, a P-type substrate 300 contains a P-well region 305 and an N-well region 310. The P-well and N-well regions are electrically isolated by relatively thick undoped isolation field oxide regions 315 which extend, in a thin layer 320, across the semiconductor surface 322. Immediately below the thin oxide layer 320 is an active region, which is sometimes referred to as a contact region. In a P-well region 305, the active region is typically comprised of a heavily doped N+region 325. In an N-well region 310, the active region is typically comprised of a heavily doped P+region 330. It is adjacent the active regions 325 and 330 that electrical elements, such as transistors (not shown), are typically formed.

While the following description will concentrate on the formation of a contact between the N+active region 325 in the P-well region 305 and a subsequently formed layer, a similar process is applicable to the formation of a contact between the P+active region 330 in the N-well region 310 and a subsequently formed layer. After any desired electrical elements are created, contacts may be formed to interconnect them. First, the surface 322 of the semiconductor wafer is typically coated with a relatively thick insulative layer 335, such as boron and/or phosphorous doped silicon dioxide glass (BPSG, BSG, or PSG). The insulative layer 335 is then planarized. For instance, it may be planarized using a chemical mechanical polishing (CMP) operation or using a resist/dry etch planarization process. Next, a contact hole 340 is formed through the insulative layer 335 down to the N+active region 325. Ideally, the contact hole 340 exposes a selected portion of the target active region 325. The contact hole 340 may be formed in any suitable manner such as, for example, via lithographic and etching techniques.

Figure 3B:
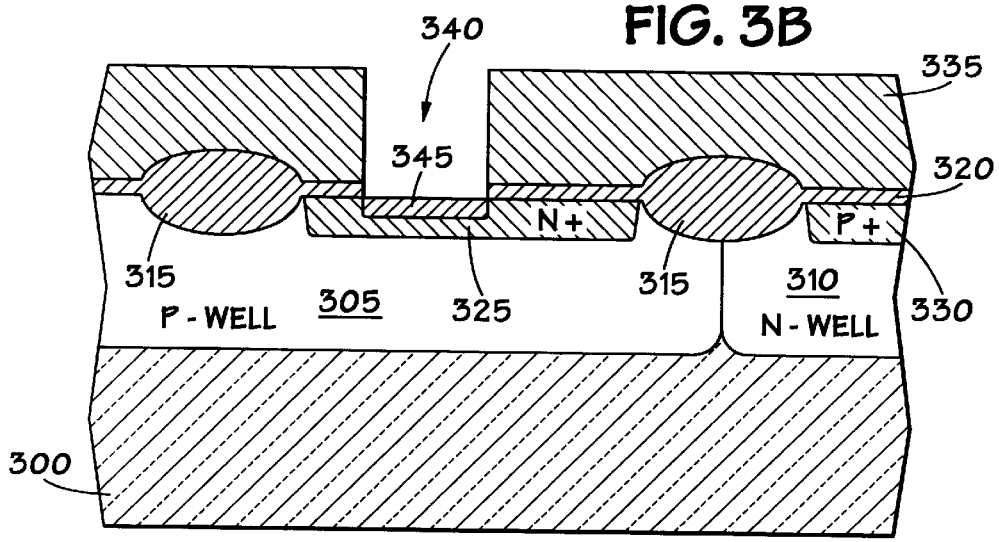
FIG. 3B shows a cross-sectional view of a semiconductor die after a enhanced implantation has been performed in accordance with the present invention.

Following formation of the contact hole 340, a plug implantation operation is performed to form a localized plug implantation region 345 of increased carrier density, as shown in FIG. 3B. Typically, the plug implantation operation is performed by an ion implantation technique using the same charge carrier as the underlying active region 325. Thus, if the active region 325 is N-type, a N-type species, such as phosphorous or arsenic, is used for the plug implantation region 345. Similarly, if the active region 330 is a P-type region, a P-type species, such as antimony or boron, is used for the plug implantation region.

Although a single plug implantation may be used, in this embodiment, a dual plug implantation operation is used where the dopants are implanted using different energies. For example, the first implantation dosage of phosphorus ions may be in the range of about 2E12 to about 2E15 ions/cm$^2$, and advantageously in the range of about 5E12 to about 5E13 ions/cm$^2$, such as about 1E13 ions/cm$^2$. The first implantation energy may be in the range of about 10 KeV to about 50 KeV, such as about 35 KeV. The second implantation dosage of phosphorus ions may be in the range of about 2E12 to about 2E15 ions/cm$^2$, and advantageously in the range of about 5E12 to about 5E13 ions/cm$^2$, such as about 1E13 ions/cm$^2$. The second implantation energy may be in the range of about 50 KeV to about 150 KeV, such as about 80 KeV. The skilled artisan will appreciate that the actual dosage and energy of the plug implantation may depend upon many factors, such as, for example, the type of circuitry being fabricated.

Following plug implantation, a first anneal operation is performed to activate the region of enhanced doping, i.e., the plug enhancement 345. The first anneal operation may be implemented by a rapid thermal process (RTP) to reduce thermal stresses on previously fabricated components. RTP is a process which uses rapid heat-up schedules and relatively high bake temperatures to anneal a semiconductor wafer in a relatively short time. RTP is often used in place of traditional furnace bakes to reduce the thermal stress imposed on the semiconductor wafer 100. In this embodiment, the temperature of the RTP may be about 700 to about 950° C., and is advantageously about 800° C., and the duration may be about 1 second to two minutes, and is advantageously about 20 seconds. Although RTP may be advantageous, a furnace anneal may also be used. The temperature of the furnaces anneal may be about 700 to about 950° C., and the duration may be from about 5 minutes to about 2 hours.

Figure 3C:
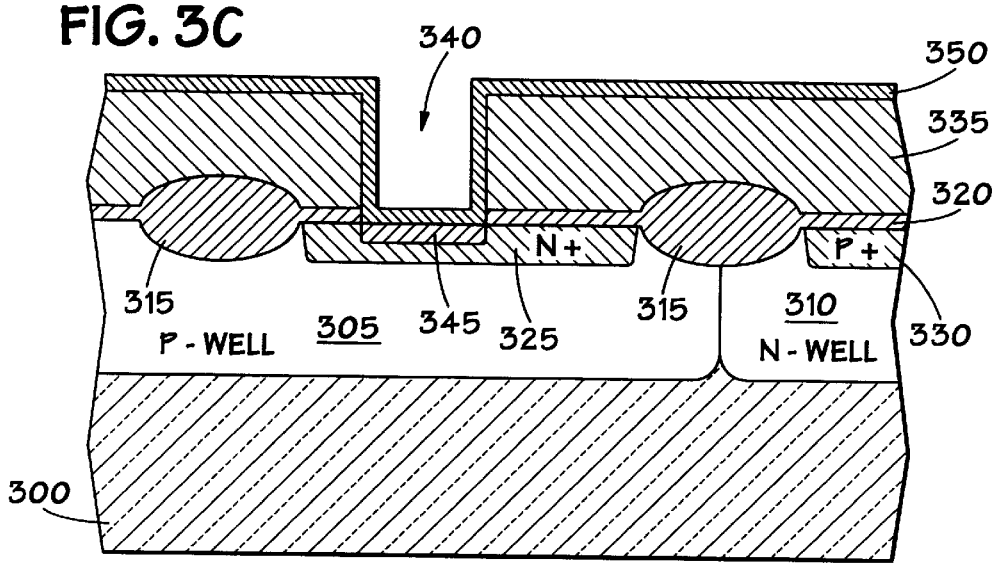
FIG. 3C shows a cross-sectional view of a semiconductor die after a barrier layer has been deposited in accordance with the invention.

As shown in FIG. 3C, the next step comprises forming a thin layer 350 of barrier material on the substrate to coat the contact hole 340. The formation of a layer of titanium is advantageous because it reacts with the silicon substrate to form titanium silicide and an upper portion of titanium nitride may be formed on it. The barrier layer 350 may be formed using physical vapor deposition (PVD) or using chemical vapor deposition (CVD). In one embodiment, the barrier layer 350 may be composed of two layers. The bottom layer may be a layer of titanium. In a contact hole having an aspect ratio of about 4:1 to 6:1, for instance, this bottom titanium layer may be about 50 to about 300 angstroms thick at the bottom of the contact hole and about 1000 to about 1500 angstroms thick at the surface. On top of this bottom titanium layer, an upper layer of titanium nitride may be formed. This upper titanium nitride layer may be formed by depositing titanium nitride, using PVD for instance. In the case of PVD, the upper titanium nitride layer may be deposited by sputtering using a target containing titanium nitride, or it may be deposited by sputtering using a titanium target in an atmosphere containing nitrogen. Alternatively, the upper titanium nitride layer may be formed by the introduction of nitrogen or ammonia to produce a surface reaction with the bottom titanium layer. As a further alternative, the upper titanium nitride layer may be formed by depositing titanium nitride using CVD. The upper titanium nitride layer, in this example, may be about 50 to about 200 angstroms thick at the bottom of the contact hole and about 100 to 500 angstroms thick at the surface.

After the barrier layer 350 is formed a second anneal operation is performed. This second anneal operation may be implemented by RTP. In this embodiment, the temperature of the RTP may be about 650 to about 800° C. and is advantageously about 725° C. The duration may be about 1 second to about two minutes and is advantageously about 20 seconds. Although RTP may be advantageous, a furnace anneal may also be used. The temperature of the furnace anneal may be about 600 to about 850° C., and the duration may be from about 1 minute to about 1 hour.

The goal of the second anneal operation is to form a good electrical contact between the barrier metal 350 and the underlying semiconductor material and to improve the adhesion characteristics between the barrier metal and a contact fill material. In the embodiment discussed thus far, both of the anneal operations may be conducted in a nitrogen atmosphere at atmospheric pressure. However, other gases, such as argon, krypton, ammonia, or mixtures of nitrogen and hydrogen may be used in place of nitrogen.

In the embodiment discussed above, the barrier layer or layers 350 were formed prior to the second anneal operation. However, the bottom portion of the barrier layer 350, e.g., the titanium layer, may be formed subsequent to the first anneal operation and prior to the second anneal operation, while the upper portion of the barrier layer 350, e.g., the titanium nitride layer, may be formed subsequent to the second anneal operation. As previously discussed, this upper titanium nitride layer may be formed by depositing titanium nitride, using PVD for instance, or it may be formed by the introduction of nitrogen or ammonia to produce a surface reaction with the bottom titanium layer.

As another alternative, the upper portion of the barrier layer 350 may be formed during the second anneal operation. This may be accomplished by performing the second anneal operation in an atmosphere containing the appropriate reactant gas. In this example, using titanium as the bottom portion of the barrier layer 350, the upper titanium nitride portion of the barrier layer 350 may be formed by performing the second anneal operation in an atmosphere containing nitrogen or ammonia.

Figure 1A:
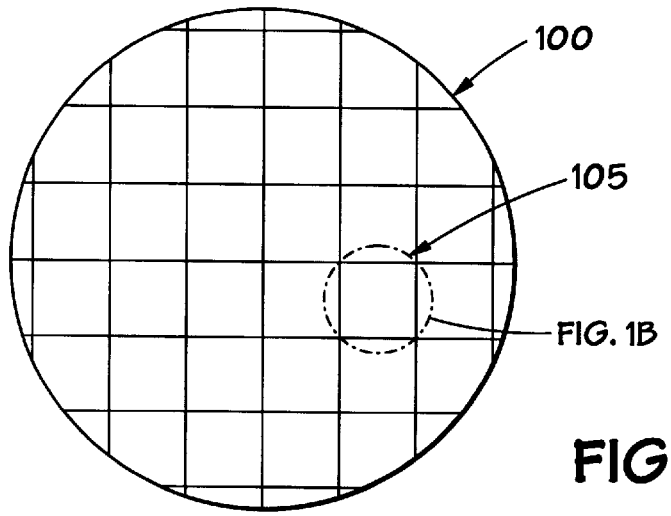
FIG. 1 shows a simplified block diagram of a semiconductor wafer and one of its constituent die regions.
Figure 1B:
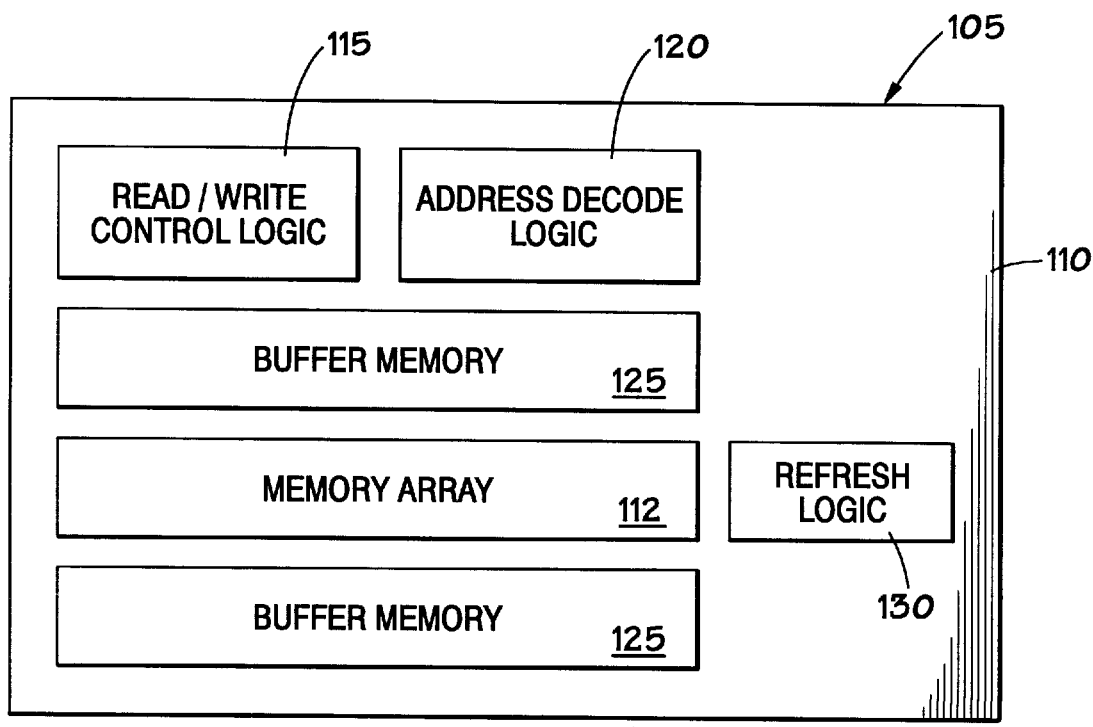
Figure 3D:
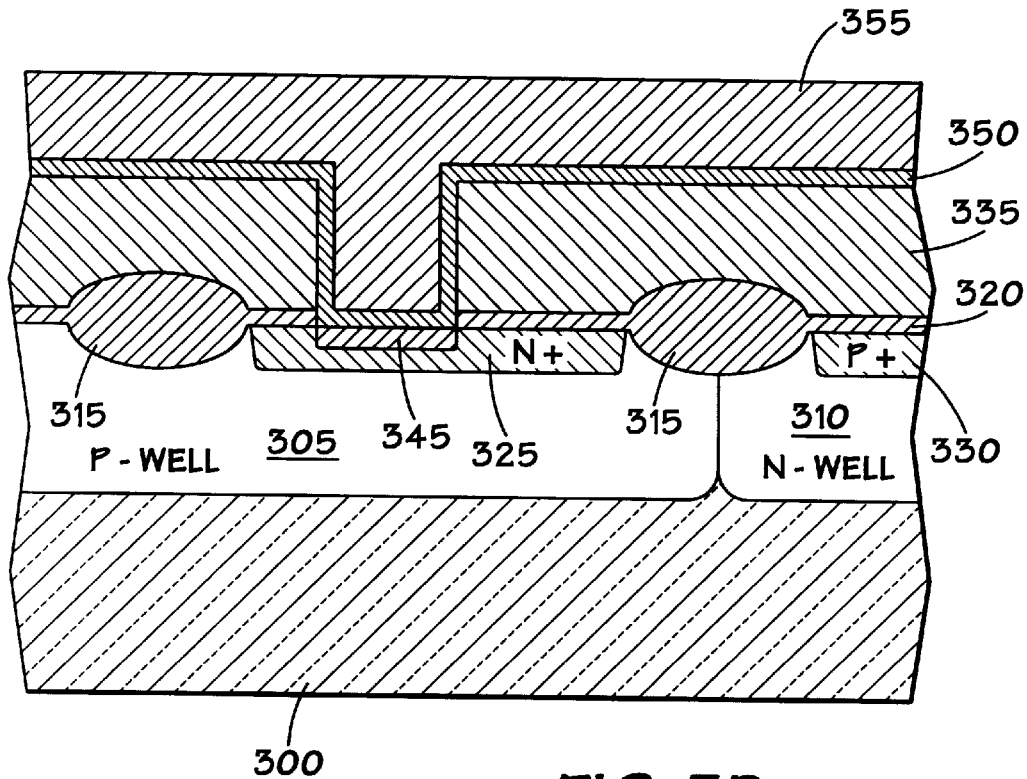
FIG. 3D shows a cross-sectional view of a semiconductor die after a contact fill material has been deposited in accordance with the invention.
Figure 3E:
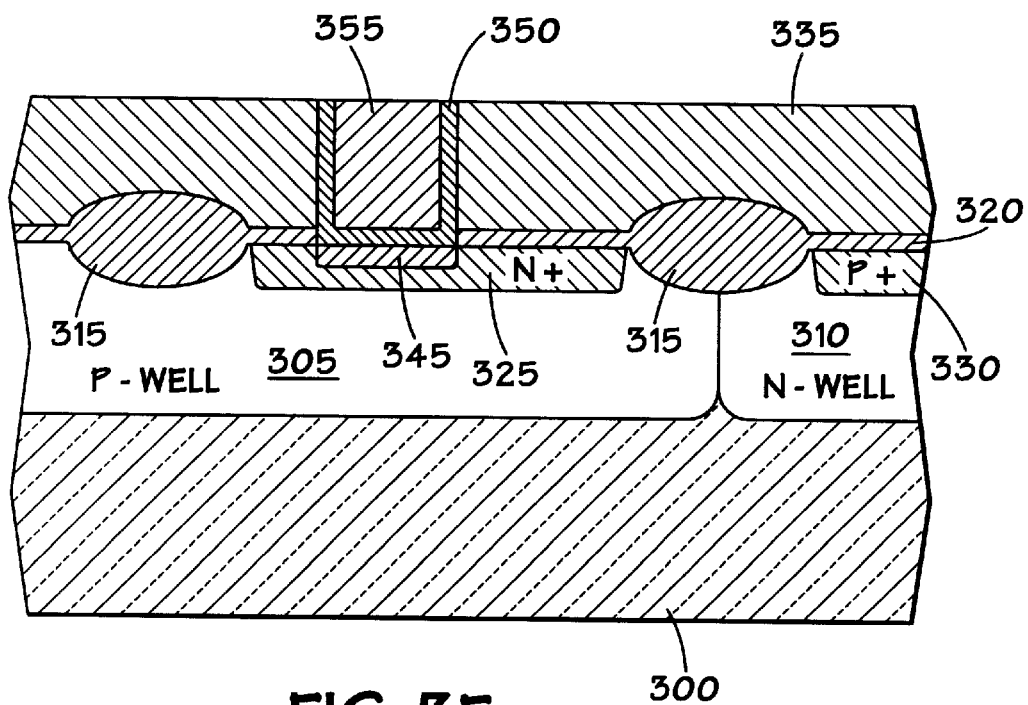
FIG. 3E shows a cross-sectional view of a completed contact in accordance with the invention.

Referring now to FIGS. 1 and 3D, after the second anneal operation, the entire surface of each die 105 is coated with a conductive material 355, such as aluminum, tungsten, or a tungsten alloy. Tungsten is typically used because it is reasonably conductive and very conformal. In other words, it fills the contact hole 340 without leaving any significant voids. Tungsten also provides a convenient means of contacting a subsequently formed conductor, such as aluminum or an aluminum-copper alloy. As a final step, excess contact material may be removed via any suitable technique, such as CMP, to leave a finished contact as shown in FIG. 3E.

By using two separate anneal operations, the functions of diffusing the plug enhancement dopant species, activating the implant, and repairing damage may be carried out independent of the silicide formation process. In this way, time and temperature conditions of each anneal operation may be optimized to perform the specific function or functions intended. Thus, the diffusion of the plug enhancement dopant species is no longer sacrificed by being tied to the process parameters required to optimize silicide formation.

Figure 5:
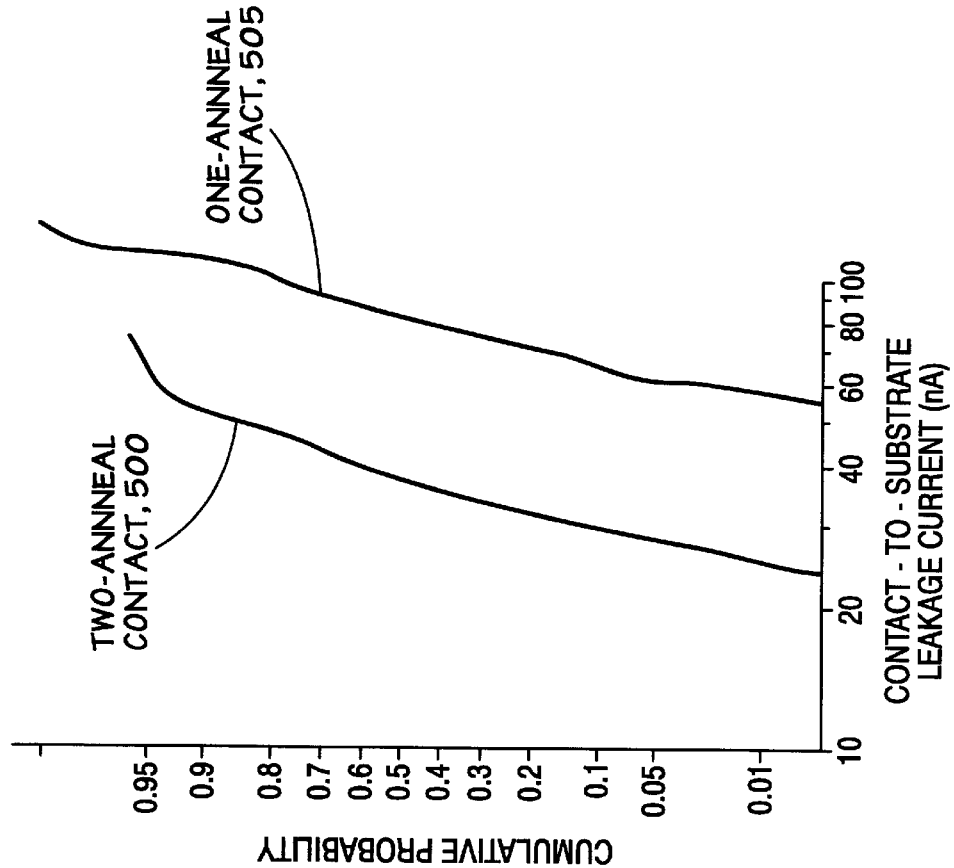
FIG. 5 compares contact-to-substrate leakage current in another contact fabricated using a two-anneal process in accordance with the invention and a prior art contact fabricated using a single anneal process.
Figure 4:
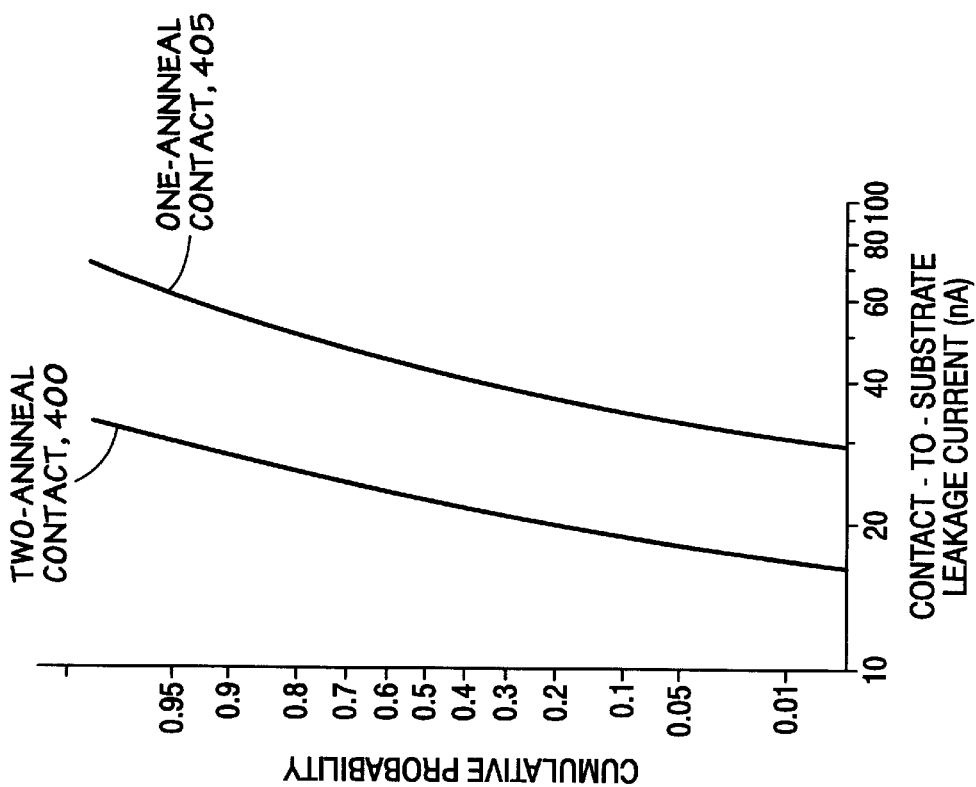
FIG. 4 compares contact-to-substrate leakage current in a contact fabricated using a two-anneal process in accordance with the invention and a prior art contact fabricated using a single anneal process.

The result of using two separate anneal operations, as demonstrated by FIGS. 4 and 5, is the formation of contacts that exhibit significantly less contact-to-substrate leakage than prior art contacts. FIG. 4 compares contact-to-substrate leakage currents of a contact made using one of the two-anneal processes described above with a similar contact fabricated in accordance with a conventional single-anneal technique. In both contacts whose leakage currents are represented by the curves 400 and 405 in FIG. 4, phosphorous ions were first implanted into the contact hole at a dose of 1E13 ions/cm$^2$ and an energy of 35 KeV. A subsequent plug implantation of phosphorous ions occurred at a dose of 1E13 ions/cm$^2$ and an energy level of 80 KeV. The first anneal operation of the two-anneal contact was performed using an RTP process at 800° C. for 20 seconds, and the second anneal operation of the two-anneal contact was performed using a second RTP process at 700° C. for 20 seconds. In contrast, the conventional contact was subjected to only a single anneal using RTP at 750° C. for 20 seconds. It can be seen that the leakage curve 400 of the contact made using a two-anneal process evidences significantly less leakage current than the leakage curve 405 of the contact made using a conventional single-anneal process.

FIG. 5 shows another comparison between the leakage current of a contact formed using a two-anneal process (curve 500) and the leakage current of a contact formed using a conventional single-anneal process (curve 505). As before, both contacts used phosphorous ions which were first implanted into the contact hole at a dose of 1E13 ions/cm² and an energy of 35 KeV, and a subsequent implantation of phosphorous ions at a dose of 1E13 ions/cm² and an energy level of 120 KeV. The two-anneal contact was first annealed via an RTP process at 800° C. for 20 seconds, and it was annealed again via a second RTP process at 700° C. for 20 seconds. As in FIG. 4, the curve 500 of the contact made using the two-anneal process clearly shows less contact-to-substrate leakage current than does the curve 505 of the conventional contact made using a single-anneal process.

As noted above, the precise choice of dopant species, concentration, and energy depends upon, among other factors, the type of circuitry being fabricated. Determination of these factors would be a matter of routine engineering. It should also be recognized that the above description omits any discussion of surface cleaning/stripping steps, because such operations are a well understood requirement in any semiconductor fabrication process.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of forming a contact in a semiconductor device, said device comprising a doped substrate having a more heavily doped active region therein and a layer formed over said region, said method comprising the steps of:
   (a) forming a contact hole in said layer and exposing a portion of the active region;
   (b) further doping the exposed portion of said active region to form an enhanced doped region;
   (c) performing a first annealing operation;
   (d) forming a barrier material on said enhanced doped region;
   (e) performing a second annealing operation; and
   (f) depositing a conductive material in said contact hole.

2. The method of claim 1, wherein step (b) comprises the step of doping the exposed portion of the active region by ion implantation.

3. The method of claim 2, wherein step (b) comprises the step of implanting ions into said exposed portion of the active region, said ions being selected from the group consisting of phosphorous, arsenic, antimony, and boron.

4. The method of claim 1, wherein step (b) comprises the steps of:
   implanting dopant ions at a first concentration and a first energy; and
   implanting dopant ions at a second concentration and a second energy.

5. The method of claim 4, wherein said first energy and said second energy are different.

6. The method of claim 1, wherein step (c) comprises the step of performing said first annealing operation using a rapid thermal process.

7. The method of claim 1, wherein step (c) comprises the step of performing said first annealing operation using a furnace anneal.

8. The method of claim 1, wherein step (e) comprises the step of performing said second annealing operation using a rapid thermal process.

9. The method of claim 1, wherein step (e) comprises the step of performing said second annealing operation using a furnace anneal.

10. The method of claim 1, wherein step (d) comprises the step of depositing titanium on said enhanced doped region.

11. The method of claim 10, wherein step (d) further comprises the step of forming titanium nitride on said titanium.

12. The method of claim 11, wherein said step of forming titanium nitride comprises the step of depositing titanium nitride on said titanium.

13. The method of claim 12, wherein the step of depositing titanium nitride comprises the step of sputtering titanium nitride on said titanium.

14. The method of claim 13, wherein the step of sputtering titanium nitride comprises the step of using a target containing titanium nitride.

15. The method of claim 13, wherein the step of sputtering titanium nitride comprises the step of using a target containing titanium and performing said sputtering in an atmosphere containing nitrogen.

16. The method of claim 11, wherein said step of forming titanium nitride comprises the step of depositing said titanium nitride using chemical vapor deposition.

17. The method of claim 10, wherein step (e) comprises the step of performing said second anneal operation in an atmosphere having a reactant gas containing nitrogen.

18. The method of claim 10, further comprising the step of forming titanium nitride on said titanium after said second annealing operation.

19. The method of claim 18, wherein the step of forming titanium nitride comprises the step of depositing said titanium nitride on said titanium.

20. The method of claim 18, wherein the step of forming titanium nitride comprises the step of reacting said titanium with a gas containing nitrogen.

21. The method of claim 12, wherein said step of depositing titanium nitride comprises the step of depositing titanium nitride by chemical vapor deposition.

22. A method of forming a contact in a semiconductor device, said device comprising a doped substrate having a first active region and a layer formed over the first active region, the first active region being doped differently than the doped substrate, the first active region containing a first dopant species, the method comprising the steps of:
   (a) forming a contact hole in said layer to expose a portion of said first active region;
   (b) implanting said exposed portion of said first active region with said first dopant species to form a second doped region;
   (c) annealing said second doped region at a temperature in a range of about 700 to about 950° C. for a time in a range of about 1 second to about 2 hours;
   (d) depositing a barrier material onto said semiconductor device;
   (e) annealing said barrier material at a temperature in a range of about 600 to about 850° C. for a time in a range of about 1 second to about 1 hour; and
   (f) depositing a conductive material in said contact hole.

23. The method of claim 22, wherein step (b) comprises the steps of:
   implanting phosphorus ions at a dosage in a range of about 2E12 to about 2E15 ions/cm² and at an energy in a range of about 10 to about 50 KeV; and
   implanting phosphorus ions at a dosage in a range of about 2E12 to about 2E15 ions/cm² and at an energy in a range of about 50 to about 150 KeV.

24. The method of claim 22, wherein step (d) comprises the step of depositing titanium on said second doped region.

25. The method of claim 24, wherein step (d) further comprises the step of forming titanium nitride on said titanium.

26. The method of claim 25, wherein said step of forming titanium nitride comprises the step of depositing titanium nitride on said titanium.

27. The method of claim 26, wherein the step of depositing titanium nitride comprises the step of sputtering titanium nitride on said titanium.

28. The method of claim 27, wherein the step of sputtering titanium nitride comprises the step of using a target containing titanium nitride.

29. The method of claim 27, wherein the step of sputtering titanium nitride comprises the step of using a target containing titanium and performing said sputtering in an atmosphere containing nitrogen.

30. The method of claim 25, wherein said step of forming titanium nitride comprises the step of reacting said titanium with a gas containing nitrogen.

31. The method of claim 24, wherein step (e) comprises the step of performing said second anneal operation in an atmosphere having a reactant gas containing nitrogen.

32. The method of claim 24, further comprising the step of forming titanium nitride on said titanium after step (e).

33. The method of claim 32, wherein the step of forming titanium nitride comprises the step of depositing said titanium nitride on said titanium.

34. The method of claim 18, wherein the step of forming titanium nitride comprises the step of reacting said titanium with a gas containing nitrogen.

35. The method of claim 26, wherein said step of depositing titanium nitride comprises the step of depositing titanium nitride by chemical vapor deposition.

36. A method of forming a memory circuit, comprising the steps of:

providing a doped semiconductor substrate having an active region and having a layer formed over said active region, said active region being doped differently than the doped substrate;

providing a memory array on said substrate;

providing peripheral circuitry on said substrate for controlling the operation of said memory array;

providing a buffer memory on said substrate;

forming a plurality of contacts in said memory array and said peripheral circuitry by forming a plurality of contact holes in said layer and exposing a plurality of portions of said active region, by further doping the exposed plurality of portions of said active region to form a plurality of enhanced doped regions, and by annealing said plurality of enhanced doped regions;

depositing a barrier material onto said plurality of enhanced doped regions; and annealing said barrier material.

* * * * *